United States Patent
Hasarchi et al.

(10) Patent No.: US 6,873,823 B2
(45) Date of Patent: Mar. 29, 2005

(54) REPEATER WITH DIGITAL CHANNELIZER

(75) Inventors: Abraham Hasarchi, Yavne (IL); Alex Baber, Ramat Gan (IL)

(73) Assignee: Dekolink Wireless Ltd., Petah Tikva (IL)

( * ) Notice: Subject to any disclaimer, the term of this patent is extended or adjusted under 35 U.S.C. 154(b) by 95 days.

(21) Appl. No.: 10/175,146

(22) Filed: Jun. 20, 2002

(65) Prior Publication Data

US 2003/0236067 A1 Dec. 25, 2003

(51) Int. Cl.⁷ .................................................. H04B 7/15
(52) U.S. Cl. ........................ 455/11.1; 455/17; 455/21; 455/67.13; 375/350
(58) Field of Search ............................ 455/11.1, 17–23, 455/119, 67.13, 67.11, 306, 307; 375/348–350

(56) References Cited

U.S. PATENT DOCUMENTS

| | | | |
|---|---|---|---|
| 4,598,410 A | | 7/1986 | Smith et al. |
| 5,867,535 A | * | 2/1999 | Phillips et al. ............... 375/295 |
| 6,151,373 A | * | 11/2000 | Dodley ........................ 375/348 |
| 6,161,024 A | * | 12/2000 | Komara .................... 455/562.1 |
| 6,336,041 B1 | * | 1/2002 | Vatalaro et al. ............. 455/561 |
| 6,370,371 B1 | * | 4/2002 | Sorrells et al. ............. 455/323 |
| 6,483,817 B1 | * | 11/2002 | Antonio et al. ............. 370/328 |
| 6,529,488 B1 | | 3/2003 | Urs et al. |
| 2001/0004586 A1 | | 6/2001 | Choe et al. |
| 2002/0013131 A1 | * | 1/2002 | Doetsch et al. ............... 455/71 |
| 2002/0039383 A1 | * | 4/2002 | Zhu et al. .................... 375/214 |
| 2002/0042290 A1 | * | 4/2002 | Williams et al. ............ 455/562 |
| 2002/0090915 A1 | * | 7/2002 | Komara et al. ............... 455/69 |
| 2002/0136288 A1 | * | 9/2002 | McCarty ...................... 375/232 |
| 2003/0103560 A1 | * | 6/2003 | Buch et al. .................. 375/229 |
| 2003/0114103 A1 | * | 6/2003 | Dinkel et al. .................. 455/17 |
| 2003/0201830 A1 | * | 10/2003 | Stengel et al. .............. 330/286 |
| 2004/0042557 A1 | * | 3/2004 | Kabel et al. ................. 375/260 |

OTHER PUBLICATIONS

International Search Report for PCT/IL03/00526.

* cited by examiner

*Primary Examiner*—Nay Maung
*Assistant Examiner*—Edan Orgad
(74) *Attorney, Agent, or Firm*—Eitan Law Group (57) ABSTRACT

In order to retransmit a communication channel at a specific frequency, a receiver may receive a signal including the communication channel's specific frequency. An analog to digital converter may generate a digital signal correlated to the received signal and the digital signal may be passed through a digital filter configured to filter the digital signal and pass frequency components at or around the frequency of the communication channel's specific frequency. A digital to analog converter may generate an analog signal correlated to the filtered digital signal and a transmitter may transmit the analog signal.

19 Claims, 5 Drawing Sheets

REPEATER WITH DIGITAL CHANNELIZER

FIELD OF THE INVENTION

The present invention relates generally to the field of communications. More specifically, the present invention relates to a repeater for a communication or transmission system (e.g. bi-directional cellular communication systems).

BACKGROUND

Degradation of signal-to-noise ratio ("SNR") occurs to a signal carried along a transmission medium (e.g. coax, unshielded conductor, wave guide, open air or even optical fiber). SNR degradation is one factor which may limit bandwidth over a transmission medium. In order to improve the SNR of signals being transmitted over long distances, and accordingly to augment the transmission distance and/or data rate, signal repeaters may be placed at intervals along the transmitting path. Repeaters are well known and may be used for optical, microwave and radio frequency (RF) communication systems. Repeaters have been used as part of cellular transmission systems to extend the range of coverage between a cellular base station and a cellular handset.

Figure 1A:
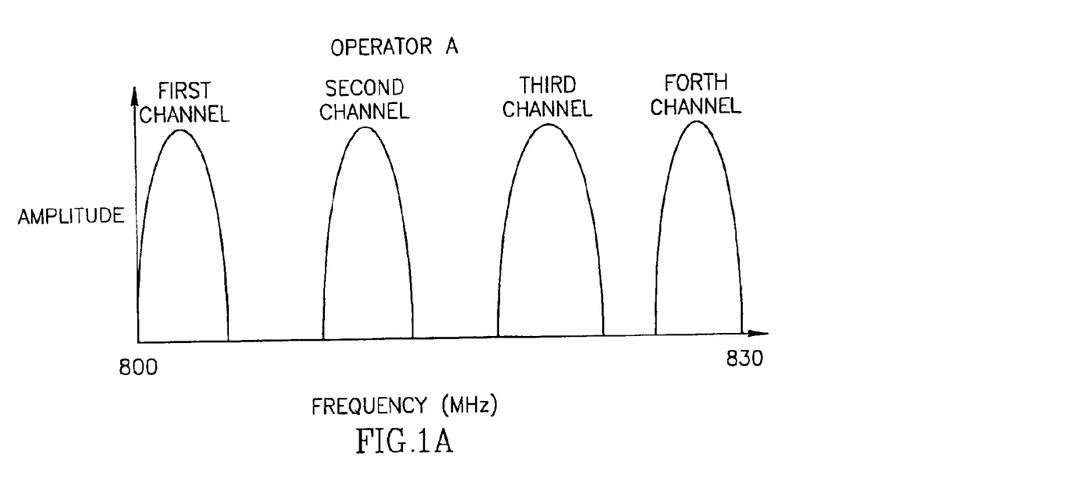
FIG. 1A is a spectral diagram exemplifying four frequencies which may be used by a first cellular operator for four communication channels in a specific geographic region.
Figure 1B:
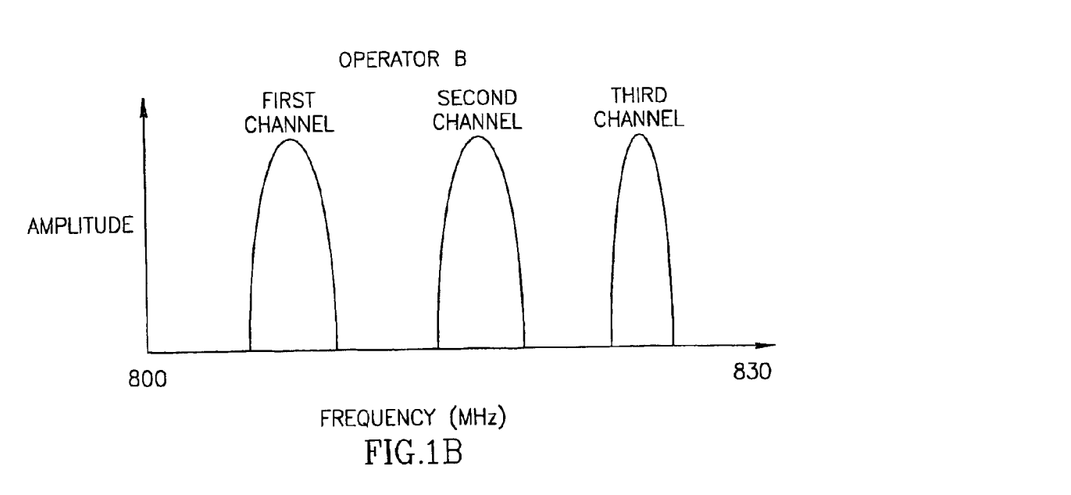
FIG. 1B is a spectral diagram exemplifying three frequencies which may be used by a second cellular operator for three communication channels in a specific geographic region.

However, the use of a repeater for one or more channels at one or more frequencies within a shared frequency range of the spectrum (e.g. 800 MHz to 830 Mhz) may produce interference. Turning now to FIG. 1A, there is shown a spectral diagram exemplifying the channel frequencies a first cellular operator may be using within the frequency range of 800 to 830 MHz. Turning now to FIG. 1B, there is shown a spectral diagram exemplifying the channel frequencies a second cellular operator in the same geographic location as the first may be using within the same frequency range, 800 to 830 MHz. As can be seen from the FIGS. 1A and 1B, each operator's channel frequencies may be distinct from the other. However, two or more channel frequencies of one operator may either be between two or more channel frequencies of the other operator or may be on either side one or more of the other operator's channel frequencies.

In order for an operator to use a repeater in the situation described above and exemplified in FIGS. 1A and 1B, the operator would either need a separate response for each channel, or the operator may use a broader band repeater to cover a frequency range within which several of the operator's channels reside. However, if a broader band repeater is used, the repeater may inadvertently retransmit one or more channels belonging to both operators. The retransmission of another operator's communication channel(s) has both legal and business implications which a cellular operator may prefer to avoid.

Analog channelized repeaters exist in the prior art. Channelized repeaters of the prior art use analog filters to exclude or filter out all signals or communication channels not belonging to the operator whose channels are to be repeated. For example, if the repeater's band of operation is 800 to 830 MHz, and the operator using the repeater has communication channels at 805 MHz, 807 MHz, and 809 MHz, the repeater may be equipped with analog filters which only allow or pass signals at the frequencies of the operator's channels. The analog channelized repeater thus retransmits only signals at the frequencies of the operator's communication channels.

Analog channelized repeaters of the prior art have numerous drawbacks which the present invention aims to address.

SUMMARY OF THE INVENTION

As part of the present invention, a receiver may receive a signal associated with a certain communication channel at a specific frequency. An analog to digital converter may generate a digital signal correlated to the received signal and the digital signal may be passed through a digital filter configured to filter the digital signal and pass frequency components at or around the frequency of the communication channel's specific frequency. A digital to analog converter may generate an analog signal correlated to the filtered digital signal and a transmitter may transmit the analog signal.

According to some embodiments of the present invention, there may be included a second digital filter configured to pass frequency components at or around a second frequency associated with a second communication channel.

According to some embodiments of the present invention, there may be included a down-converter to down-convert a received signal to an intermediate signal. An up-converter may also be included to up-convert to a transmission frequency an analog signal correlated to the filtered digital signal.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

As part of the present invention, a receiver may receive a signal associated with a communication channel at a specific frequency. An analog to digital converter may generate a digital signal correlated to the received signal and the digital signal may be passed through a digital filter configured to filter the digital signal and pass frequency components at or around the frequency of the communication channel's specific frequency. A digital to analog converter may generate an analog signal correlated to the filtered digital signal and a transmitter may transmit the analog signal.

According to some embodiments of the present invention, there may be included a second digital filter configured to pass frequency components at or around a second frequency associated with a second communication channel.

According to some embodiments of the present invention, there may be included a down-converter to down-convert a received signal to an intermediate signal. An up-converter may also be included to up-convert to a transmission frequency an analog signal correlated to the filtered digital signal.

Figure 2:
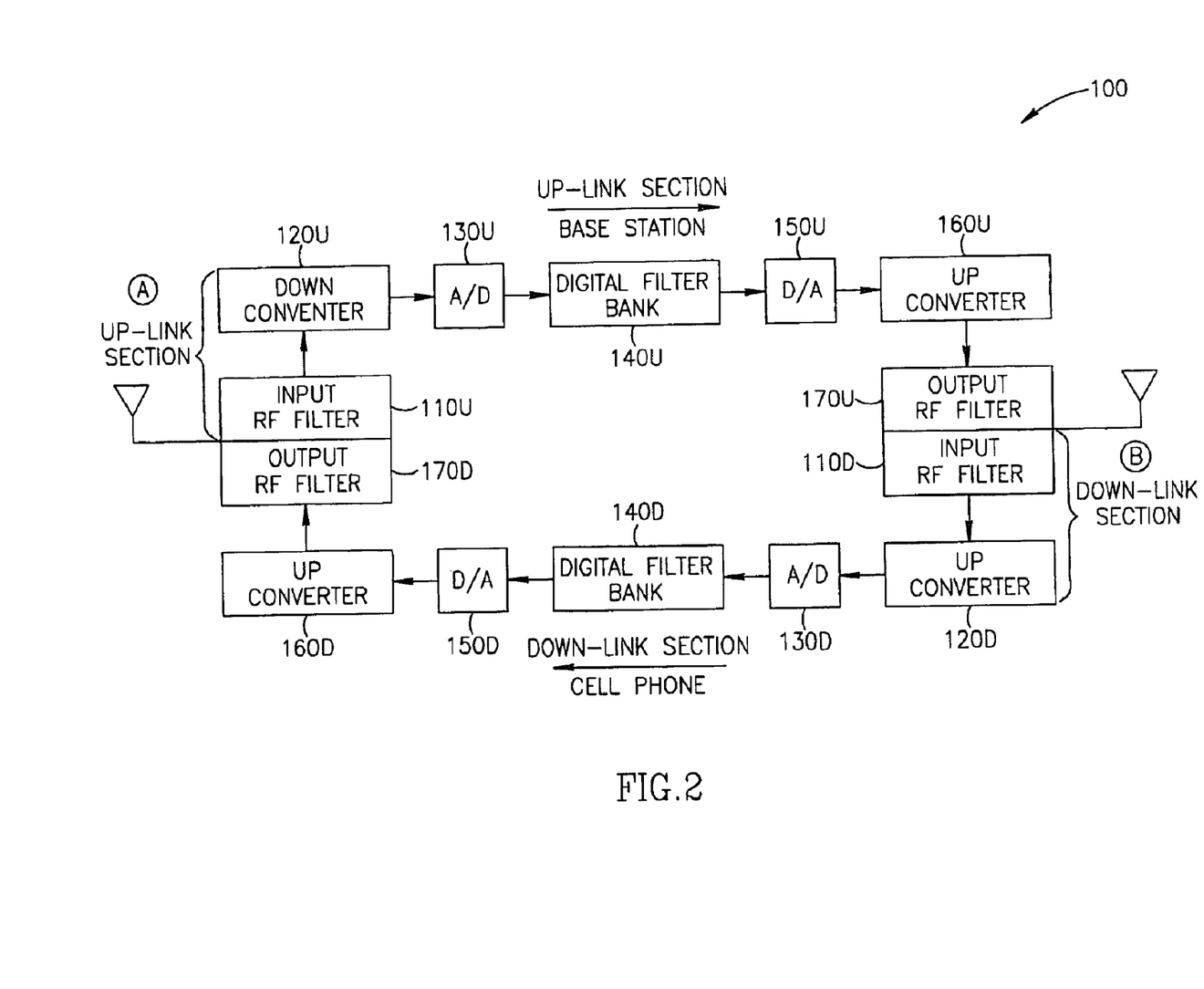
FIG. 2 is a block diagram showing an example of a bi-directional repeater with a digital channelizer according to some embodiment of the present invention.

Turning now to FIG. 2, there is shown a block diagram of a bi-directional repeater 100 with a digital channelizer according to the present invention. The bi-directional repeater 100 may include two basic sections: (A) an upstream or up-link section which receives signals from a mobile device (e.g. cell phone) and retransmits the signal to a base-station; and (B) a downstream or down-link section which receives signals from a base-station and retransmits the signals to a mobile device.

Figure 3:
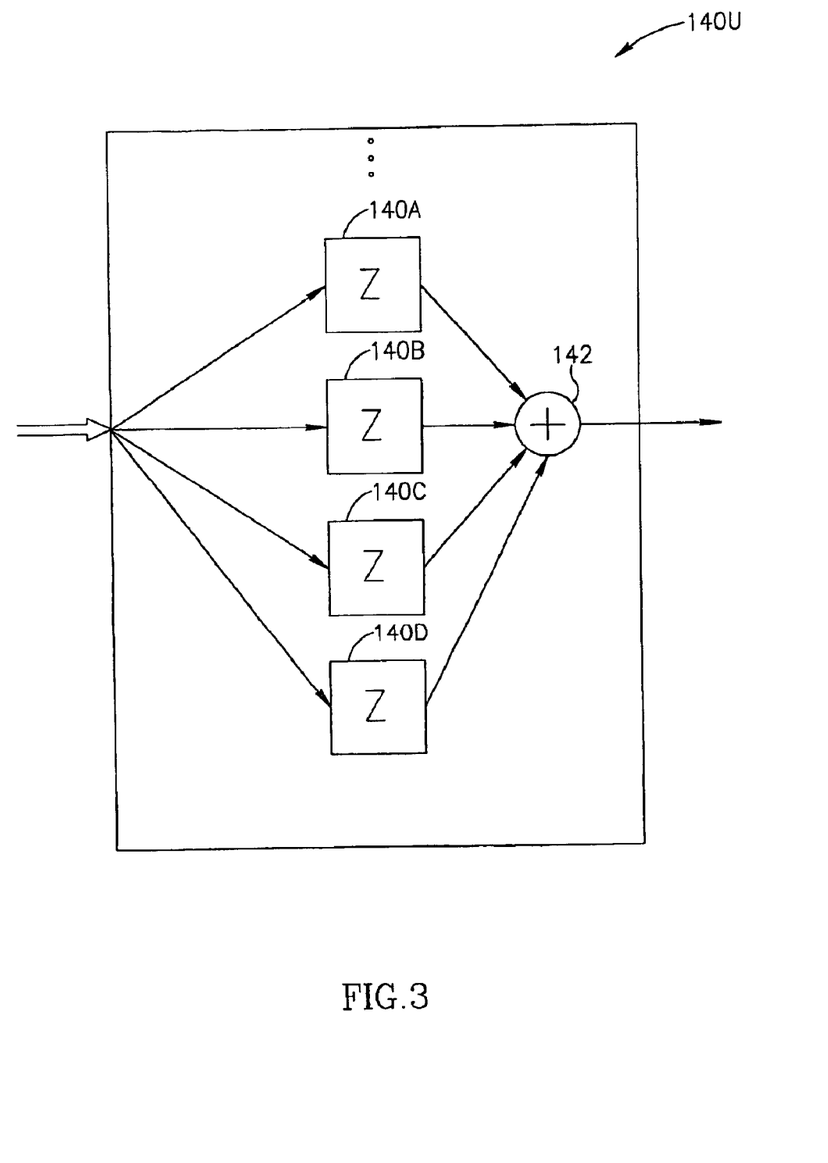
FIG. 3 is a block diagram showing a more detailed view of the filter bank in FIG. 3.

Looking first at the up-link section (A) from left to right on FIG. 2, there may be an input filter 110U, which for this example, may be a radio frequency ("RF") filter, or more specifically, may be a filter tuned to pass frequencies in the range of 800 to 830 MHz, for example. The input RF filter 110U may receive signals from an antenna and may pass frequencies in the frequency range of one or more communication channels to be repeated to a down converter 120U. The down converter 120U may mix a received signal with a sine or cosine wave of a given frequency such that the received signal is down-converted to an intermediate frequency ("IF"). Either the input RF filter 110U or the down converter 120U may include a signal amplifier (Not shown in FIG. 2). An analog to digital ("A/D") converter 130U may sample the IF signal and may generate a digital signal representing the sampled IF signal. The digital signal representing the IF signal may enter digital filter bank 140U. FIG. 3 shows a more detailed view of digital filter bank 140U including digital filters 140a to 140d.

Turning now to FIG. 3, there is shown a block diagram of a digital filter bank 140U including digital filters 140a to 140d. A digital signal entering digital filter bank 140U may be applied to each of the digital filters 140a through 140d and the output of each of the digital filters may be combined by an adder 142 or by a functionally equivalent device. Each of the filters within the filter bank 140U may have a separate and distinct frequency response. Digital filters are well known in the field of communications. Implementation of a digital filter bank may be performed on a single or multiple processors (e.g. DSP) or may be implemented on a single or multiple dedicated digital filtering circuits. In the example of FIG. 3, there is shown four discrete digital filter circuits. As part of some embodiment of the present invention, digital filters 140a through 140d may be field programmable digital filters ("FPDF"). That is, each filter's transfer function, along with its frequency response, may be reprogrammed or adjusted.

Figure 4A:
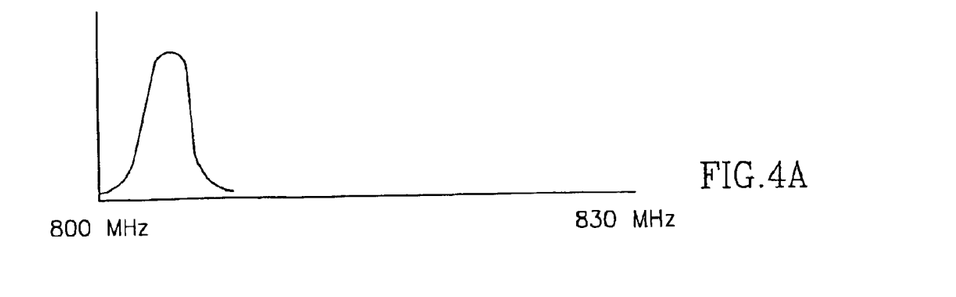
FIGS. 4A to 4D spectral diagrams showing examples of frequency responses of the digital filters 140A through 140D in FIG. 3.
Figure 4B:
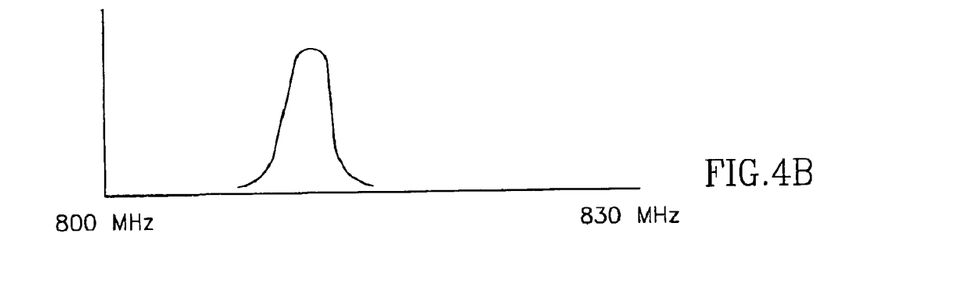
Figure 4C:
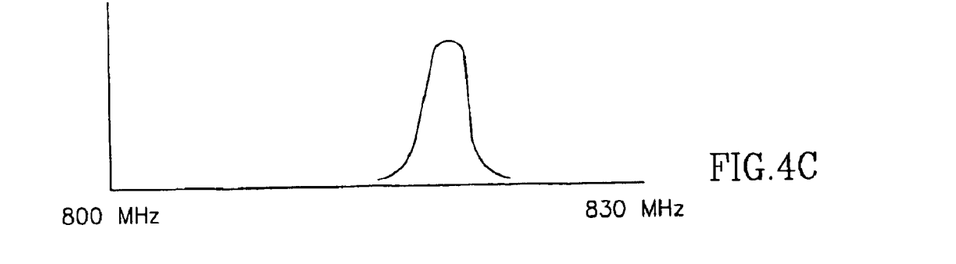
Figure 4D:
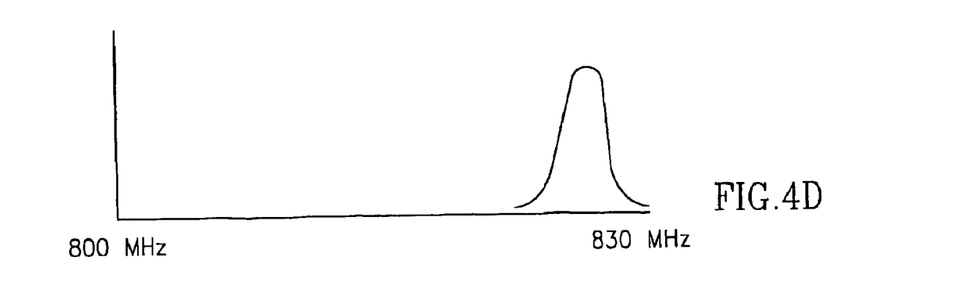

Turning now to FIGS. 4A through 4B, there are shown examples of possible frequency responses for digital filters 140a through 140d of FIG. 3, where digital filters 140a through 140b correspond to the first through the fourth communication channels exemplified in FIG. 1A, respectively. That is, the impulse response or frequency transfer characteristic for each digital filter 140a through 140d may be separately set or adjusted to pass frequency components of a digital signal that are at or around the carrier frequency of the filter's corresponding communication channel. For example; digital filter 140a may be programmed with a transfer function having a band pass frequency response peaking at or around the carrier frequency of the first communication channel shown in FIG. 1A; Digital filter 140b may be programmed with a transfer function having a band pass frequency response peaking at or around the carrier frequency of the second communication channel shown in FIG. 1A, etc . . .

The design of digital filters and digital filter transfer functions is well known. Although specific filters and transfer functions are mentioned above, any digital filter and transfer function combination, currently known or to be devised in the future, may be used as part of the present invention.

Now turning back to FIG. 2, there is shown, directly after the digital filter bank 140U, a digital to analog converter ("D/A") 150U. The D/A 150U may convert the filtered digital signal output of the digital filter bank 140U to an analog signal, which analog signal may then be up-converted by up-converter 160U to the original frequency which was received at input RF filter 110U. An output filter 170U may be used to remove any harmonics which may have been introduced into the signal by the up-converter 160U. Either the up-converter 160U or the output RF filter 170U may include a signal amplifier (not shown in FIG. 2). The filtered signal may then propagate to and out of a transmission antenna.

The downstream or down-link (B) section of the bi-directional repeater 100 may almost mirror the up-stream section (A) discussed above. A difference being that the input RF filter 110D, digital filter bank 140D filters and output RF filter 170D may be tuned to receive and pass frequencies of downstream communication channels, as opposed to passing frequencies at or around upstream communication channels.

The specific frequency bands to which each of the filters is set may depend on the specific frequencies of the communication channels, upstream and downstream, an operator may wish to repeat within a specific geographic location. The frequencies shown in FIGS. 1A and 1B are only examples of such communication channel frequencies. No distinction is made between upstream and downstream channels in FIGS. 1A and 1B. However, it will be understood by one of ordinary skill in the art that in a cellular system, there may be a corresponding upstream communication channel for each down stream communication channel. The relation between upstream channel frequency and downstream channel frequency may be fixed, or each may be negotiated separately between a mobile device and a base station.

Figure 5:
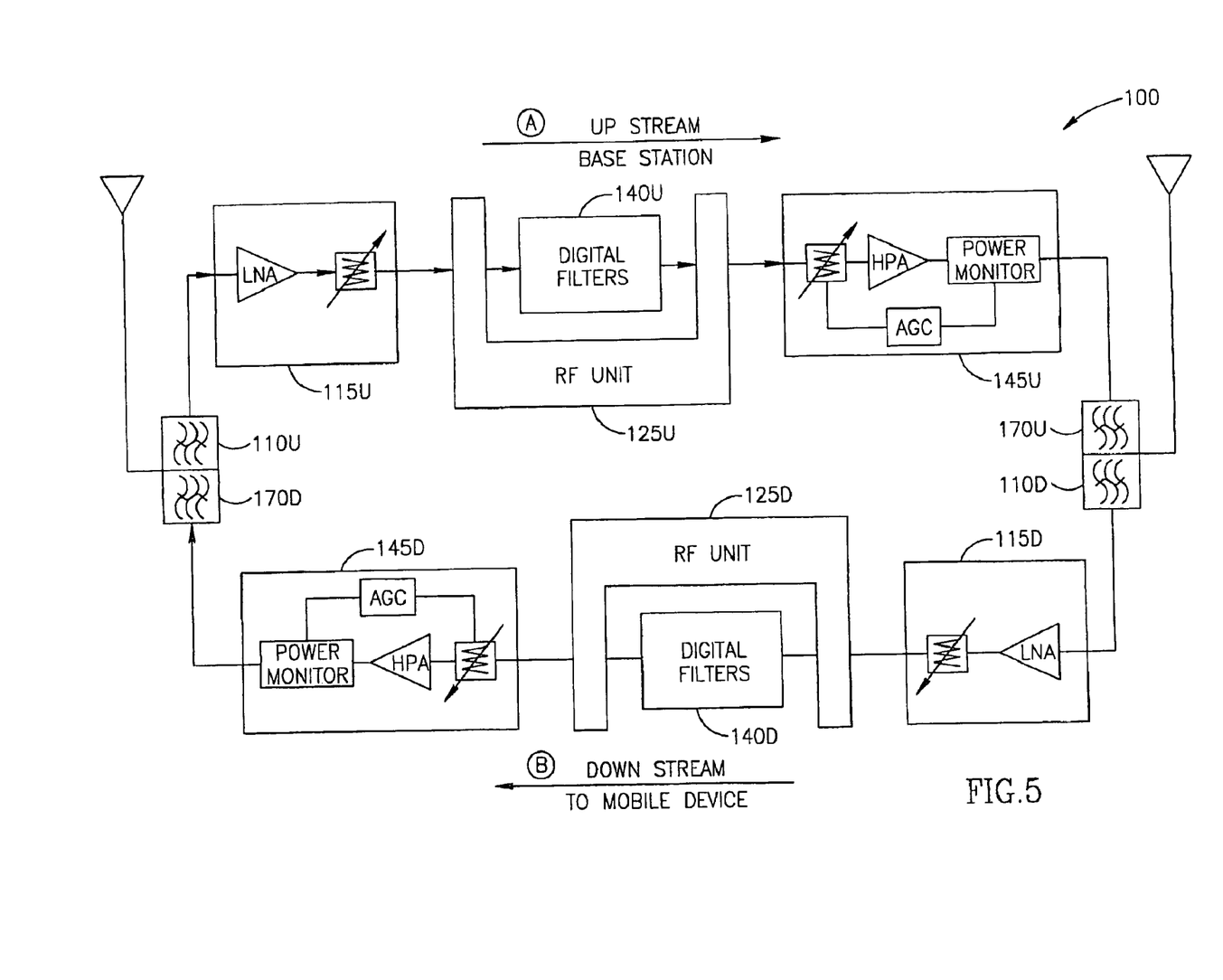
FIG. 5 is a block diagram showing another example of a bi-directional repeater with a digital channelizer according to some embodiment of the present invention.

Turning now to FIG. 5, there is shown another possible embodiment of a bi-directional repeater 100 according to the present invention. As in the bi-directional repeater of FIG. 2, there are two sections; (A) an upstream or up-link section, and (B) a downstream or down-link section. Also, as in the embodiment of FIG. 2, the up-link and down-link sections may substantially mirror one another except for the frequencies they are tuned to pass and retransmit.

Looking at the downstream or down-link section (B) of the bi-directional repeater 100 of FIG. 5, there may be a duplexer including an input RF filter 110D. The input RF filter 110D may lead to a pre-filtering stage 115D which may include a low noise amplifier ("LNA") and an attenuator. The output of the pre-filtering block 115D may enter an RF unit 125D which may down convert the output and may also include an A/D converter. Digital filters in digital filter block 140D may be similar to the ones described for FIGS. 2, 3 or 4A through 4D, or may be any other digital filters suitable to the present invention. The output of the digital filter block 140D may enter the RF unit 125D which may up convert the output and may also include a D/A converter. A power amplifier block 145D may include an attenuator, a high-power amplifier, and a power monitor. An automatic gain control circuit ("AGC") may adjust the attenuator such that the output signal from the power amplifier block 145D remains substantially steady. The output signal of the power amplifier block 145D may propagate to and through a duplexer including an output filter 170D.

As for the bi-directional repeater 100 in FIG. 2, the bi-directional repeater 100 of FIG. 5 may be configured to repeat specific sets of communication channels, at or around specific carrier frequencies, in the upstream direction, and to repeat specific sets of communication channels, at or around specific carrier frequencies, in the downstream direction. Digital filters in the digital filter banks or block, 140U and 140D, may be adjusted to pass only frequencies at or around the carrier frequencies of the relevant communication channels. Carrier frequency offsets due to up-conversion or down-conversion may be taken into account and compensated for within the digital filters. Furthermore, the bi-directional repeater 100 of the present invention may be adjusted to notch out narrow band noise interference within the communication channels' frequency band.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. A method of retransmitting a communication channel comprising:
    receiving a signal having a frequency within a frequency range of the communication channel;
    generating a digital signal correlated to the received signal;
    filtering the digital signal with a digital filter bank configured to pass a plurality of frequency components within said frequency range, wherein said digital filter bank is able to generate a separate and distinct transfer function for each of at least some of said frequency components;
    generating an analog signal correlated to the filtered digital signal; and
    transmitting the analog signal correlated to the filtered digital signal.

2. The method according to claim 1, further comprising down-converting the received signal to an intermediate frequency prior to generating a digital signal.

3. The method according to claim 2, further comprising up-converting the analog signal correlated to the filtered digital signal prior to transmitting the analog signal.

4. A method of retransmitting a communication channel comprising:
    receiving a signal having a frequency within a frequency range of the communication channel;
    generating a digital signal correlated to the received signal;
    filtering the digital signal with a digital filter bank configured to pass a plurality of frequency components within said frequency range, wherein said digital filter bank is able to generate a separate and distinct transfer function for each of at least some of said frequency components;
    generating an analog signal correlated to the filtered digital signal;
    transmitting the analog signal correlated to the filtered digital signal; and
    filtering the digital signal with a second digital filter bank configured to pass a plurality of frequency components within a second frequency range, associated with a second communication channel, wherein said digital filter bank is able to generate a separate and distinct transfer function for each of at least some of said frequency components.

5. The method according to claim 4, further comprising combining the digital signals out from each of said filtering steps and generating an analog signal correlated to the combined digital signal.

6. The method according to claim 5, further comprising transmitting the analog signal correlated to the combined digital signal.

7. A system for retransmitting a communication channel within a predetermined frequency range, said system comprising:
- a receiver to receive a signal having a frequency within the frequency range of the communication channel;
- an analog to digital converter to generate a digital signal correlated to the received signal;
- a digital filter bank configured to filter the digital signal by passing a plurality of frequency components within said frequency range, wherein said digital filter bank is able to generate a separate and distinct frequency transfer function for each of at least some of said frequency components;
- a digital to analog converter to generate an analog signal correlated to the filtered digital signal; and
- a transmitter to transmit the analog signal correlated to the filtered digital signal.

8. The system according to claim 7, further comprising a down converter to convert the received signal to an intermediate frequency.

9. The system according to claim 8, further comprising an up converter to convert the analog signal correlated to the filtered digital signal to a transmission frequency.

10. The system according to claim 7, further comprising a second digital filter bank configured to pass a plurality of frequency components within a second frequency range, wherein said digital filter bank is able to generate a separate and distinct transfer function for each of at least some of said frequency components associated with a second communication channel.

11. The system according to claim 10, further comprising a summing unit to combine outputs from said first and second digital filters.

12. The system according to claim 7, wherein said digital filter bank is configured to notch out narrow band noise interference within a frequency band of said communication channel.

13. A system for retransmitting a communication channel within a predetermined frequency range, said system comprising:
- a receiver to receive a signal having a frequency within the frequency range of the communication channel;
- an analog to digital converter to generate a digital signal correlated to the received signal;
- a field programmable digital filter bank configured to filter the digital signal by passing a plurality of frequency components within said frequency range, wherein said digital filter bank is able to generate a separate and distinct transfer function for each of at least some of said frequency components;
- a digital to analog converter to generate an analog signal correlated to the filtered digital signal; and
- a transmitter to transmit the analog signal correlated to the filtered digital signal.

14. The system according to claim 13, wherein said field programmable digital filter bank is locally controllable.

15. The system according to claim 13, wherein said digital filter is remotely controllable.

16. The system according to claim 13, wherein said filter bank is able to choose an optimal transfer function for each of said plurality of frequency components.

17. A system for retransmitting a communication channel within a predetermined frequency range, said system comprising:
- a receiver to receive a signal having a frequency within the frequency range of the communication channel;
- a first gain control unit to adjust said signal to produce an input signal;
- an analog to digital converter to generate a digital signal correlated to the input signal;
- a digital filter bank configured to filter the digital signal by passing a plurality of frequency components within said frequency range, wherein said digital filter bank is able to generate a separate and distinct transfer function for each of at least some of said frequency components;
- a digital to analog converter to generate an analog signal correlated to the filtered digital signal;
- a second gain control unit to adjust said analog signal to produce a desired output signal; and
- a transmitter to transmit the output signal correlated to the filtered digital signal.

18. The system according to claim 17, wherein said second gain control unit comprises a variable gain amplifier.

19. The system according to claim 17, wherein said digital bank is further configured to filter the digital signal by passing a plurality of frequency components within said frequency range, wherein said digital filter bank is able to generate a separate and distinct filter gain for each of at least some of said frequency components.

* * * * *

UNITED STATES PATENT AND TRADEMARK OFFICE
CERTIFICATE OF CORRECTION

| | | |
|---|---|---|
| PATENT NO. | : 6,873,823 C1 | |
| APPLICATION NO. | : 90/010159 | |
| DATED | : September 22, 2009 | |
| INVENTOR(S) | : Abraham Hasarchi and Alex Baber | |

It is certified that error appears in the above-identified patent and that said Letters Patent is hereby corrected as shown below:

Col. 2, line 58, claim 13 should be corrected to read as follows:

13. A system for retransmitting [a communication channel] *radio signals* within a predetermined frequency range, said system comprising:
- a receiver to receive [a signal] *signals each* having a frequency within the frequency range [of the communication channel];
- an analog to digital converter to generate a digital signal correlated to [the] *each* received signal;
- a field programmable digital filter bank configured to filter the digital [signal] *signals* by passing a plurality of *signals corresponding to a plurality of communication channels, wherein each channel is configured to pass multiple signals covering a band of* frequency components within said frequency range, wherein said digital filter bank is [able] *programmed* to generate a separate and distinct transfer function for each of at last some of said [frequency components] *channels;*
- a digital to analog converter to generate an analog signal correlated to [the] *each* filtered digital signal; and
- a transmitter to transmit the analog signal correlated to [the] *each* filtered digital signal.

Signed and Sealed this
Nineteenth Day of April, 2011

David J. Kappos
*Director of the United States Patent and Trademark Office*

UNITED STATES PATENT AND TRADEMARK OFFICE
CERTIFICATE OF CORRECTION

PATENT NO.        : 6,873,823 C1                                 Page 1 of 1
APPLICATION NO.   : 90/010159
DATED             : September 22, 2009
INVENTOR(S)       : Abraham Hasarchi and Alex Baber It is certified that error appears in the above-identified patent and that said Letters Patent is hereby corrected as shown below:

Col. 3, line 39 claim 16 should be corrected to read as follows:

16. [The] *A* system [according to claim 13,] *for retransmitting radio signals within a predetermined frequency range, said system comprising:*
   *a receiver to receive signals each having a frequency within the frequency range;*
   *an analog to digital converter to generate a digital signal correlated to each received signal;*
   *a field programmable digital filter bank configured to filter the digital signals by passing a plurality of signals corresponding to a plurality of communication channels, each channel is configured to pass multiple signals covering a band of frequency components within said frequency range, wherein said digital filter bank is programmed to generate a separate and distinct transfer function for each of at least some of the channels;*
   *a digital to analog converter to generate an analog signal correlated to each filtered digital signal;*
   *a transmitter to transmit the analog signals correlated to each filtered digital signal; and*
   wherein said filter bank is able to choose an optimal transfer function for each of said band of frequency components.

Signed and Sealed this
Seventeenth Day of May, 2011

David J. Kappos
*Director of the United States Patent and Trademark Office*

(12) EX PARTE REEXAMINATION CERTIFICATE (7076th)
United States Patent
Hasarchi et al.

(10) Number: US 6,873,823 C1
(45) Certificate Issued: Sep. 22, 2009

(54) REPEATER WITH DIGITAL CHANNELIZER

(75) Inventors: Abraham Hasarchi, Yavne (IL); Alex Baber, Ramat Gan (IL)

(73) Assignee: Dekolink Wireless Ltd., Qiryat-Arieh, Petah-Tikva (IL)

Reexamination Request:
No. 90/010,159, May 7, 2008

Reexamination Certificate for:
Patent No.: 6,873,823
Issued: Mar. 29, 2005
Appl. No.: 10/175,146
Filed: Jun. 20, 2002

(51) Int. Cl.
*H04B 7/155* (2006.01)

(52) U.S. Cl. .................. 455/11.1; 375/350; 455/17; 455/21; 455/67.13

(58) Field of Classification Search .................. None
See application file for complete search history.

(56) References Cited

U.S. PATENT DOCUMENTS

| | | |
|---|---|---|
| 5,634,191 A | 5/1997 | Beasley |
| 5,999,574 A | 12/1999 | Sun et al. |
| 6,697,603 B1 | 2/2004 | Lovinggood et al. |

FOREIGN PATENT DOCUMENTS

KR  2002-0028030  4/2003

*Primary Examiner*—Deandra M Hughes (57) ABSTRACT

In order to retransmit a communication channel at a specific frequency, a receiver may receive a signal including the communication channel's specific frequency. An analog to digital converter may generate a digital signal correlated to the received signal and the digital signal may be passed through a digital filter configured to filter the digital signal and pass frequency components at or around the frequency of the communication channel's specific frequency. A digital to analog converter may generate an analog signal correlated to the filtered digital signal and a transmitter may transmit the analog signal.

FIG. 2 Amended

US 6,873,823 C1

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.
THE DRAWING FIGURES HAVE BEEN CHANGED AS FOLLOWS:
In FIG. 2, the formerly "upconverter" #120D, has been changed to an "downconverter".

AS A RESULT OF REEXAMINATION, IT HAS BEEN DETERMINED THAT:

Claims 5–6 and 11–12 are cancelled.

Claims 1, 4, 7, 10, 13–17 and 19 are determined to be patentable as amended.

Claims 2–3, 8–9 and 18, dependent on an amended claim, are determined to be patentable.

New claims 20–47 are added and determined to be patentable.

1. A method of retransmitting [a communication channel] *radio signals* comprising:
    receiving [a signal] *signals each* having a frequency within a frequency range [of the communication channel];
    generating a digital signal correlated to [the] *each* received signal;
    filtering the digital [signal] *signals* with a digital filter bank configured to pass a plurality of *signals corresponding to a plurality of communication channels, wherein each channel is configured to pass multiple signals covering a band of* frequency components within said frequency range, wherein said digital filter bank is [able] *programmed* to generate a separate and distinct transfer function for each of at least some of said [frequency components] *channels*;
    generating an analog signal correlated to [the] *each* filtered digital signal; and
    transmitting the analog signal correlated to [the] *each* filtered digital signal.
4. A method of retransmitting [a communication channel] *radio signals* comprising:
    receiving [a signal] *in an uplink section signals each* having a frequency within a *first* frequency range [of the communication channel];
    generating a digital signal correlated to [the] *each* received signal;
    filtering the digital [signal] *signals* with a *first* digital filter bank configured to pass a plurality of *signals corresponding to a plurality of communication channels, wherein each channel is configured to pass multiple signals covering a band of* frequency components within said frequency range, wherein said *first* digital filter bank is [able] *programmed* to generate a separate and distinct transfer function for each of at least some of said [frequency components] *channels*;
    generating an analog signal correlated to [the] *each* filtered digital signal;
    transmitting the analog signal correlated to [the] *each* filtered digital signal; and
    *in a downlink section* filtering [the] digital [signal] *signals* with a second digital filter bank configured to pass a plurality of *signals corresponding to a plurality of communication channels, wherein each channel is configured to pass multiple signals covering a band of* frequency components within a second frequency range, associated with [a second communication channel] *said first frequency range*, wherein said *second* digital filter bank is [able] *programmed* to generate a separate and distinct transfer function for each of at least some of said [frequency components] *channels, and*
    *wherein the downlink section is a mirror of the uplink section except to the associated frequency ranges.*
7. A system for retransmitting [a communication channel] *radio signals* within a predetermined frequency range, said system comprising:
    a receiver to receive [a signal] *signals each* having a frequency within the frequency range [of the communication channel];
    an analog to digital converter to generate a digital signal correlated to [the] *each* received signal;
    a digital filter bank configured to filter the digital [signal] *signals* by passing a plurality of *signals corresponding to a plurality of communication channels, wherein each channel is configured to pass multiple signals covering a band of* frequency components within said frequency range, wherein said digital filter bank is [able] *programmed* to generate a separate and distinct frequency transfer function for each of at least some of said [frequency components] *channels*;
    a digital to analog converter to generate an analog signal correlated to [the] *each* filtered digital signal; [and]
    a transmitter to transmit the analog signal correlated to [the] *each* filtered digital signal; *and*
    *wherein said digital filter bank is configured to notch out narrow band interference within the frequency band of at least one of said plurality of communication channels.*
10. The system according to claim 7, *wherein said digital filter bank operates in an uplink section and* further comprising *in a downlink section* a second digital filter bank configured to pass a plurality of *signals corresponding to a plurality of communication channels, wherein each channel is configured to pass multiple signals having a band of* frequency components within a second frequency range, wherein said *second* digital filter bank is [able] *programmed* to generate a separate and distinct transfer function for each of at least some of said [frequency components associated with a second communication channels] *channels; and*
    *wherein the downlink section is a mirror of the uplink section.*
13. A system for retransmitting [a communication channel] *radio signals* within a predetermined frequency range, said system comprising:
    a receiver to receive [a signal] *signals each* having a frequency within the frequency range [of the communication channel];
    an analog to digital converter to generate a digital signal correlated to [the] *each* received signal;
    a field programmable digital filter bank configured to filter the digital [signal] *signals* by passing a plurality of *sig-* nals corresponding to a plurality of communication channels, wherein each channel is configured to pass multiple signals covering a band of frequency components within said frequency range, wherein said digital filter bank is [able] *programmed* to generate a separate and distinct transfer function for each of at least some of said frequency components;

a digital to analog converter to generate an analog signal correlated to [the] *each* filtered digital signal; and a transmitter to transmit the analog signal correlated to [the] *each* filtered digital signal.

14. The system according to claim [13] *16*, wherein said field programmable digital filter bank is locally controllable.

15. The system according to claim [13] *16*, wherein said digital filter is remotely controllable.

16. [The] *A* system [according to claim 13,] *for retransmitting radio signals within a predetermined frequency range, said system comprising:* a receiver to receive signals each having a frequency within the frequency range;

an analog to digital converter to generate a digital signal correlated to each received signal;

a field programmable digital filter bank configured to filter the digital signals by passing a plurality of signals corresponding to a plurality of communication channels, each channel is configured to pass multiple signals covering a band of frequency components within said frequency range, wherein said digital filter bank is programmed to generate a separate and distinct transfer function for each of at least some of the channels;

a digital to analog converter to generate an analog signal correlated to each filtered digital signal;

a transmitter to transmit the analog signals correlated to each filtered digital signal; and wherein said filter bank is able to choose an optimal transfer function for each of said plurality of frequency components.

17. A system for retransmitting [a communication channel] *radio signals* within a predetermined frequency range, said system comprising:

a receiver to receive [a signal] *signals each* having a frequency within the frequency range [of the communication channel];

a first gain control unit *including an RF amplifier and variable attenuator* to adjust said signal [to produce an input signal] *level*;

*an RF down converter unit to produce an input signal;* an analog to digital converter to generate a digital signal correlated to [the] *each* input signal;

a digital filter bank configured to filter the digital [signal] *signals* by passing a plurality of *signals corresponding to a plurality of communication channels, wherein each channel is configured to pass multiple signals covering a band of* frequency components within said frequency range, wherein said digital filter bank is [able] *programmed* to generate a separate and distinct transfer function for each of at least some of said [frequency components] *channels*;

a digital to analog converter to generate an analog signal correlated to [the] *each* filtered digital signal;

*an RF up converter;* a second gain control unit *including an RF amplifier and a variable attenuator* to adjust said analog [signal] *signals such that the power of the output signal remains substantially steady* to produce a desired output signal; and a transmitter to transmit the output [signal] *signals* correlated to [the] *each* filtered digital signal.

19. The system according to claim 17, wherein said digital filter is further configured [to filter the digital signal by passing a plurality of frequency component within said frequency range, wherein said digital filter band is able] to generate a separate and distinct filter gain for each of at least some of said [frequency components] *channels*.

20. *The method of claim 1, wherein said digital filter bank is programmed to generate a separate and distinct transfer function respectively for each channel.*

21. *The method of claim 1, wherein at least one transfer function notches out narrowband interference within the frequency band of its communication channel.*

22. *The method of claim 1, wherein said digital filter bank is able to choose an optimal transfer function for each of said plurality of communication channels.*

23. *The method of claim 1, further comprising the step of variably attenuating the received signal to adjust it; and*

*RF down converting the attenuated signal to an IF down converted frequency, prior to generating the digital signal.*

24. *The method of claim 23, and further comprising the step of up converting to RF the analog signals generated, and variably attenuating the RF signals to adjust them such that the power of the signals transmitted remains substantially steady.*

25. *The method of claim 4, wherein said digital filter bank is programmed to generate a separate and distinct transfer function respectively for each channel.*

26. *The method of claim 4, wherein at least one transfer function notches out narrow band interference within the frequency band of its communication channel.*

27. *The method of claim 4, wherein said digital filter bank is able to choose an optimal transfer function for each of said plurality of communication channels.*

28. *The method of claim 4, further comprising the step of variably attenuating the received signal to adjust its level, and*

*RF down converting the attenuated signal to an IF frequency prior to generating the digital signal.*

29. *The method of claim 28, and further comprising the step of up converting to RF the analog signals generated, and variably attenuating the RF signals to adjust them such that the power of the signals transmitted remains substantially steady.*

30. *The system of claim 7, wherein said digital filter bank is programmed to generate a separate and distinct frequency transfer function for each of said channels.*

31. *The system of claim 7, wherein said filter bank is able to choose an optimal transfer function for each of said plurality of communication channels.*

32. *The system of claim 7, and further comprising:*

*a variable attenuator to adjust the level of the received signals, and*

*an RF down converter to down convert the adjusted signals to IF, the analog to digital converter receiving the output from the down converter.*

33. *The system of claim 32, and further comprising an up converter unit to up convert to RF the analog signals generated, and*

*a further variable attenuator for attenuating the RF signals to adjust them such that the power of the signals transmitted remains substantially steady.*

34. The system of claim 16, wherein said filter bank is programmed to generate a separate and distinct transfer function respectively for each of said channel filters.

35. The system of claim 16, wherein at least one transfer function notches out narrow band interference within the frequency band of its communication channel.

36. The system of claim 16, and further comprising:
a variable attenuator to adjust the received signals and
an RF down converter to down convert the adjusted signals to RF, the analog to digital converter receiving the output from the down converter.

37. The system of claim 36, and further comprising a up converter unit to up convert to RF the analog signals generated, and
a further variable attenuator for attenuating the RF signals to adjust them such that the power of the signals transmitted remains substantially steady.

38. The system of claim 17, wherein at least one transfer function notches out narrow band interference within the frequency band of its communication channel.

39. The system of claim 17, wherein said digital filter band is able to choose an optimal transfer function for each of said plurality of communication channels.

40. A method of transmitting radio signals, comprising:
receiving signals each having a frequency within a frequency range;
attenuating the received signals to adjust it;
RF down converting the attenuated signals to IF frequency;
generating a digital signal correlated to each received signal;
filtering the digital signals with a digital filter bank configured to pass signals corresponding to a plurality of communication channels, wherein each channel is configured to pass multiple signals covering a band of frequency components within said frequency range, wherein said digital filter bank is programmed to generate a separate and distinct transfer function for each of at least some of said channels, at least one transfer function notching out narrow band interference within the frequency band of its communication channel,
generating an analog signal correlated to each filtered digital signal, and
transmitting the analog signal correlated to each filtered digital signal.

41. A method as in claim 40, wherein said digital filter bank is programmed to generate has a separate and distinct transfer function respectively for each channel.

42. The method of claim 41, wherein said digital filter bank is able to choose an optimal transfer function for each of said plurality of communication channels.

43. The method of claim 40, and further comprising the step of up converting to RF the analog signals generated, and variably attenuating the RF signals to adjust them such that the power of the signals transmitted remains substantially steady.

44. A system for retransmitting radio signals within a predetermined frequency range, said system comprising:
a receiver to receive signals each having a frequency within the frequency range;
a first variable attenuator unit to adjust said signal level to produce an input signal;
an RF down converter to down convert the input signal to IF;
an analog to digital converter to generate a digital signal correlated to each down converted input signal;
a digital filter bank configured to filter the digital signals by passing signals corresponding to a plurality of communication channels, wherein each channel is configured to pass multiple signals covering a band of frequency components within said frequency range, wherein said digital filter bank is programmed to generate a separate and distinct transfer function for each of at least some of said channels, at least one transfer function notching out narrowband interference within the frequency band of its communication channel;
a digital to analog converter to generate an analog signal correlated to each filtered signal, and
a transmitter to transmit the analog signal correlated to each filtered digital signal.

45. The system of claim 44, wherein said filter bank is programmed to generate a separate and distinct frequency transfer function for each of said channel filters.

46. The system of claim 44, wherein said filter bank is able to choose an optimal transfer function for each of said plurality of communication channels.

47. The system of claim 44, and further comprising a up converter unit to up convert to RF the analog signals generated, and
a further variable attenuator for attenuating the RF signals to adjust them such that the power of the signals transmitted remains substantially steady.

* * * * *